United States Patent [19]

Fox

[11] Patent Number: 4,763,074
[45] Date of Patent: Aug. 9, 1988

[54] AUTOMATIC TUNING CIRCUIT FOR MAGNETIC RESONANCE QUADRATURE ANTENNA SYSTEM

[75] Inventor: Timothy R. Fox, Chicago, Ill.

[73] Assignee: Kabushiki Kaisha Toshiba, Kawasaki, Japan

[21] Appl. No.: 32,630

[22] Filed: Apr. 1, 1987

[51] Int. Cl.$^4$ ........................................... G01R 33/20
[52] U.S. Cl. .................................... 324/314; 324/318; 324/322
[58] Field of Search ............... 324/309, 314, 318, 322; 128/653; 333/219, 221, 223

[56] References Cited

U.S. PATENT DOCUMENTS 3,999,118 12/1976 Hoult ................................... 324/314
4,695,801 9/1987 Arakawa et al. .................... 324/318
4,707,664 11/1987 Fehn et al. ........................... 324/318

OTHER PUBLICATIONS

"QD Fourier NMR Detection: . . . " A. G. Redfield et al., Journal of Magnetic Resonance 19, No. 2, Aug. (1975), pp. 250–254.

Primary Examiner—Stewart J. Levy
Assistant Examiner—Louis M. Arana
Attorney, Agent, or Firm—Finnegan, Henderson, Farabow, Garrett and Dunner

[57] ABSTRACT

An automatic tuning circuit for a quadrature coil antenna system of a magnetic resonance imaging system is provided which includes a test coil for applying a test signal to each of a first and a second channel of the antenna to produce a first channel signal on the first channel and a second channel signal on the second channel. A phase meter assembly is coupled to the first and second antenna channels for measuring the phase of the second channel signal relative to the phase of the first channel signal to obtain an error signal. An auto-tune assembly is coupled to the phase meter assembly and to the second antenna channel for adjusting the phase of the second channel signal in response to the error signal to obtain a desired phase relationship between the first and second channel signals. The invention also includes a method for automatically tuning a quadrature coil antenna system of a magnetic resonance imaging system which includes a first step of applying a test signal having a selected magnetic field polarization vector to the first and second antenna channels to produce the first channel signal on the first antenna channel and the second channel signal on the second antenna channel, a second step of measuring the phase of the second channel signal relative to the phase of the first channel signal and producing the error signal corresponding to the difference of the first channel signal phase and the second channel signal phase, and a third step of adjusting the resonant frequency of the second antenna channel in response to the error signal.

13 Claims, 8 Drawing Sheets

AUTOMATIC TUNING CIRCUIT FOR MAGNETIC RESONANCE QUADRATURE ANTENNA SYSTEM

BACKGROUND OF THE INVENTION

1. Field of the Invention

The present invention relates to magnetic resonance imaging systems and, more specifically, to an automatic tuning circuit for a quadrature antenna system of a magnetic resonance imaging system.

2. Description of the Related Art

Magnetic resonance imaging ("MRI"), also known as nuclear magnetic resonance ("NMR") imaging, has become a valuable tool as a safe, non-invasive means for obtaining information in the form of images of an object under examination. For example, MRI can be used as a medical diagnostic tool by providing images of the whole or selected portions of the human body without the use of X-ray photography.

MRI systems take advantage of the magnetic properties of spinning nuclei of chemical species found in the observed object in the following manner. Each of the nuclei has an internal spin axis and a magnetic pole aligned with the spin axis. The magnetic pole is a vector quantity representing the magnitude and direction of the magnetic field of the nucleus. Application of an external static magnetic field $B_o$ causes the magnetic poles to align themselves along the external magnetic field lines.

The MRI system disturbs this alignment by transmitting an electromagnetic signal to the object. The magnetic field $B_1$ of this transmitted electromagnetic signal is circularly polarized and is perpendicular to the static magnetic field $B_o$. This signal causes the nuclei to precess about the external static magnetic field lines. The frequency of this precession typically is in the radio frequency ("RF") range. More specifically, the precession frequency generally lies within a relatively narrow bandwidth of about 1 to 100 kHz at a center frequency of between 1 and 100 MHz.

As the nuclei precess, they radiate an electromagnetic signal having a circularly polarized rotating magnetic field. The frequency of this rotating magnetic field is generally equal to the precession frequency of the nuclei. The radiated signal is received by the MRI system to produce an image of the object under examination.

The circularly polarized magnetic fields of the transmitted and received RF signals described above rotate in a plane perpendicular to the static magnetic field $B_o$. For convenience, a rectilinear coordinate system is used here to describe the orientation of these magnetic fields. The static magnetic field $B_o$ is assumed to be in the direction of the Z axis. Therefore, the rotation of the circularly polarized magnetic fields is in the X-Y plane.

Quadrature coil antennas have been used in MRI systems to transmit and receive the RF signals described above. An example of such a quadrature coil antenna is shown in "Quadrature Detection Coils—A Further $\sqrt{2}$ Improvement in Sensitivity," C. N. Chen, D. I. Hoult, and V. J. Sank, *J. Magn. Reson.*, Vol. 54, 324-327 (1983). This antenna includes a cylindrical antenna structure having four saddle coils arranged into a first coil system or pair (two coils) and a second coil system or pair (two coils). The coils of the first coil pair are opposite each other. The coils of the second coil pair are also opposite each other and are oriented 90° relative to the first coil pair.

As the magnetic field produced by the precessing nuclei rotates in the antenna structure, a voltage signal is impressed on the first coil pair corresponding to the component of the rotating field along the X axis while a voltage signal is impressed on the second coil pair corresponding to the component of the rotating field along the Y axis. The signal on the first coil pair has the same frequency as the signal on the second coil pair, but these signals are 90° out of phase, i.e., there is a 90° phase angle between the signals.

In a representative MRI system using a quadrature coil antenna, each of the coil pairs is coupled to a respective antenna coupling circuit. The first coil pair and its coupling circuit comprise a first channel while the second coil and its coupling circuit comprise a second channel. Each of the coil pairs and its coupling circuit comprise a parallel resonant circuit, the resonant frequency of which is adjustable or tunable using a tuning voltage applied at a tuning voltage terminal. Each of the coupling circuits is coupled to a single receiver circuit. The receiver circuit receives the respective signals of the first and second channels, adjusts the 90° phase difference or phase angle between the signals to put them in phase, and combines these signals to produce a single output signal. Noise in the respective channels is assumed to be uncorrelated. Therefore, combination of the signals results in an improved signal-to-noise ratio ("SNR") for the MRI system.

Proper operation of the MRI system as described above requires that the signals of the first and second channels are coherent and in phase when they are combined. This requires the resonant frequency of the first channel to be substantially equal to the resonant frequency of the second channel. A difference in these resonant frequencies or a different phase angle prevents proper superposition of the signals.

The resonant frequencies of the first and second channels in a practical MRI system may vary for a number of reasons. For example, while ideally the design of the first and second coil pairs and their respective coupling circuits is identical, slight variations will inevitably exist, and performance will be affected accordingly. The tuning signal applied to the respective coupling circuits to adjust their resonant frequencies, which ideally is the same for both coupling circuits, may also differ in practice.

In addition, the phase difference of the signals of the first and second channels as they are combined may be non-zero for a number of reasons. For example, the physical alignment of the first coil pair may not be exactly 90° with respect to the second coil pair. Furthermore, the phase delay of one channel may be greater than the delay of the other channel.

Accordingly, it is an intent of the invention to provide an automatic tuning circuit for a quadrature antenna system of an MRI system which maintains a substantial equality of the resonant frequencies of the respective channels of the quadrature antenna system.

It is also an intent of the invention to provide an automatic tuning circuit for a quadrature antenna system of an MRI system which maintains a desired phase relationship of one channel of the quadrature antenna system relative to the other channel.

It is further an intent of the present invention to provide an automatic tuning circuit for a quadrature antenna system of an MRI system which achieves the intentions stated above during operation of the MRI system.

Additional intentions and advantages of the invention will be set forth in the description which follows and in part will be obvious from the description or may be learned by practice of the invention. The intentions and advantages of the invention may be realized and obtained by means of the instrumentalities and combinations particularly pointed out in the appended claims.

SUMMARY OF THE INVENTION

To achieve the foregoing intentions, and in accordance with the purposes of the invention as embodied and broadly described here, an automatic tuning circuit for a quadrature coil antenna system of an MRI system is provided which comprises means for applying a test signal to each of a first and a second channel of the antenna to produce a first channel signal on the first channel and a second channel signal on the second channel, means coupled to the first and the second antenna channels for measuring the phase of the second channel signal relative to the phase of the first channel signal to obtain an error signal, and means coupled to the phase measuring means and to the second antenna channel for adjusting the resonant frequency of the second antenna channel in response to the error signal to obtain a desired phase relationship between the first and the second channel signals.

The test signal applying means preferably comprises a magnetic field source, e.g., a test coil, having a magnetic field polarization vector oriented 45° with respect to the magnetic field polarization vector of each of the first and the second antenna channels.

The phase measuring means preferably comprises means for providing a first channel oscillator signal to convert the first channel signal into a first channel intermediate frequency signal, means for providing a second channel local oscillator signal 90° out of phase with respect to the first channel local oscillator signal to convert the second channel signal into a second channel intermediate frequency signal, and means for measuring the phase of the first channel intermediate frequency signal relative to the phase of the second channel intermediate frequency signal to produce the error signal.

The adjusting means preferably includes means operatively coupled to the phase measuring means for controlling the adjustment of the resonant frequency of the second channel signal, and means operatively coupled to the control means and to the second antenna channel for applying adjustment signals to the second antenna channel to adjust the resonant frequency of the second channel signal relative to the resonant frequency of the first channel signal in response to the error signal and the control means to obtain the desired phase relationship between the first and second channel signals.

Also to achieve the foregoing intentions, and in accordance with the purposes of the invention as embodied and broadly described here, a method for automatically tuning a quadrature coil antenna system of an MRI system is provided which comprises a first step of applying a test signal having a selected magnetic field polarization vector to a first and a second channel of the antenna to produce a first channel signal on the first antenna channel and a second channel signal on the second antenna channel, a second step of measuring the phase of the second channel signal relative to the phase of the first channel signal and producing an error signal corresponding to the difference of the first channel signal phase and the second channel signal phase, and a third step of adjusting the resonant frequency of the second antenna channel in response to the error signal. Preferably, the magnetic field polarization vector of the first step is oriented 45° with respect to the response axis of each of the first and the second antenna channels.

The second step of the method preferably includes a first substep of providing a first channel local oscillator signal and converting the first channel signal into the first channel intermediate frequency signal, a second substep of providing a second channel local oscillator signal 90° out of phase with respect to the first channel local oscillator signal and converting the second channel signal into the second channel intermediate frequency signal, and a third substep of measuring the phase of the first channel intermediate frequency signal relative to the phase of the second channel intermediate frequency signal to produce the error signal.

The third step of the method preferably includes adjusting the resonant frequency of the second antenna channel in response to the error signal during a first portion of an operating cycle of the MRI system, and holding the adjustment of the second antenna channel relative to the resonant frequency of the first antenna channel during a second portion of the operating cycle of the MRI system.

BRIEF DESCRIPTION OF THE DRAWINGS

The accompanying drawings, which are incorporated in and constitute a part of the specification, illustrate a presently preferred embodiment and method of the invention and, together with the general description given above and the detailed description of the preferred embodiment and method given below, serve to explain the principles of the invention. Of the drawings:

FIG. 4 illustrates the orientation of the test signal applying means of the preferred embodiment of the invention as shown in FIG. 1, wherein

DESCRIPTION OF THE PREFERRED EMBODIMENT AND METHOD

Figure 1:
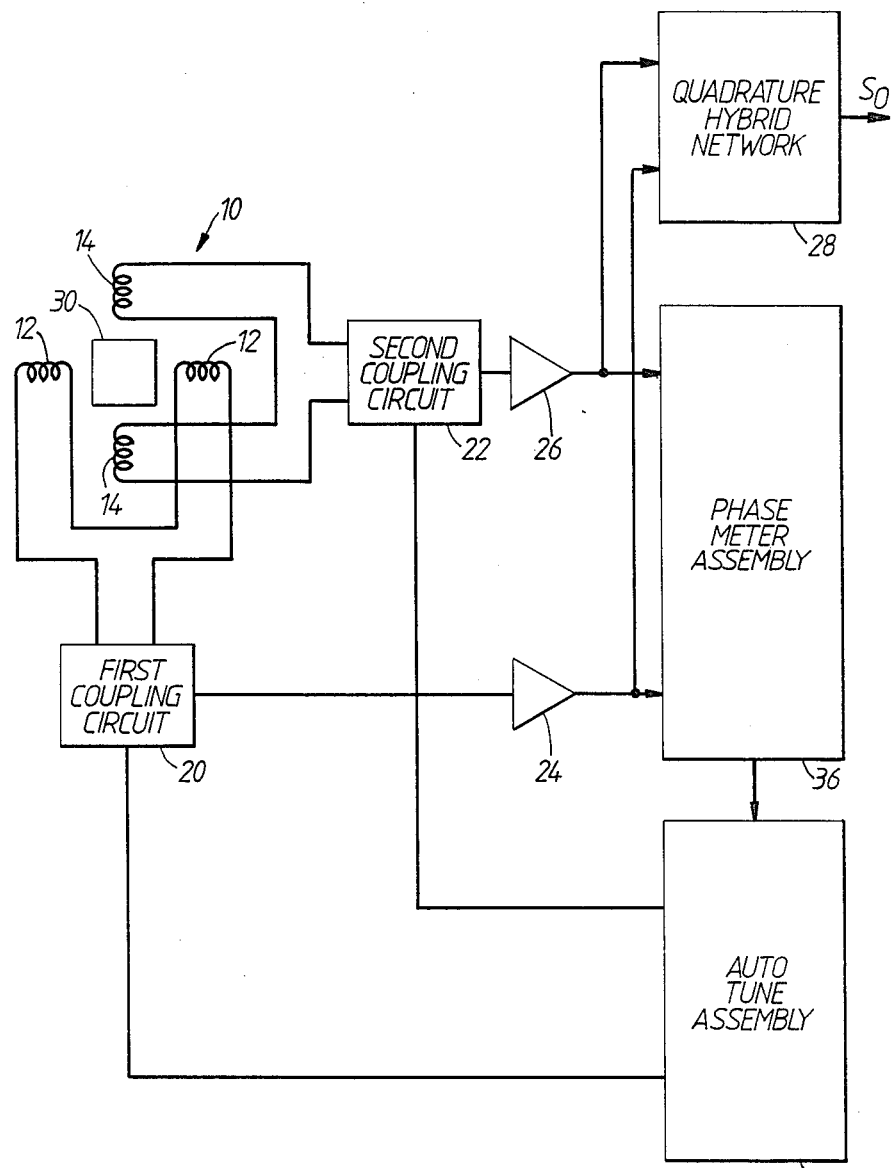
FIG. 1 is a block diagram of the automatic tuning circuit of a preferred embodiment of the present invention coupled to a quadrature coil antenna system.

Reference will now be made in detail to the presently preferred embodiment and method of the invention as illustrated in the accompanying drawings, wherein like reference characters designate like or corresponding parts throughout the several drawings.

Figure 2A:
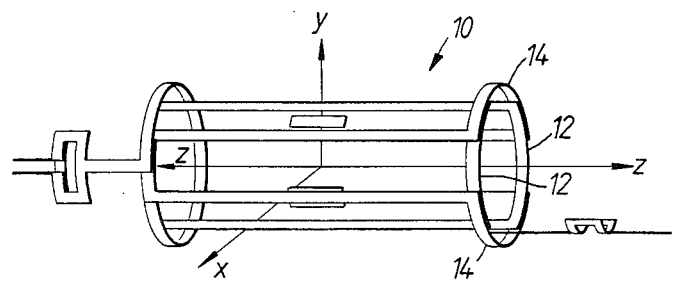
FIG. 2A is a perspective view of the quadrature coil antenna shown in FIG. 1.
Figure 2B:
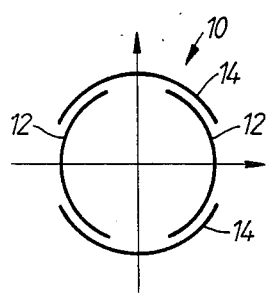
FIG. 2B is an end view of the quadrature coil antenna illustrated in FIGS. 1 and 2A.
Figure 2C:
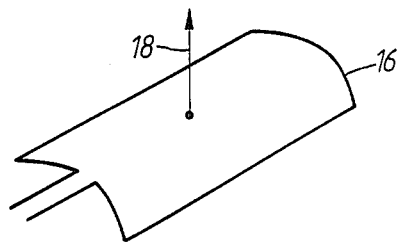
FIG. 2C is a perspective view of one of the coils of the quadrature antenna shown in FIGS. 1, 2A and 2B, which shows the magnetic field polarization vector of the coil.

The automatic tuning circuit of the preferred embodiment is shown coupled to a quadrature coil antenna system in FIG. 1. The antenna system to which the automatic tuning circuit is coupled includes a quadrature coil antenna 10, an example of which is shown in FIG. 2. As shown in FIGS. 2A and 2B, antenna 10 is in the shape of a cylinder and includes a first coil pair 12 and a second coil pair 14. Each of the four individual coils making up the first and second coil pairs is substantially identical to the other coils. An individual one of these coils 16 is shown in FIG. 2C. The shape of the coil conforms to a portion of the cylinder, extending down the length of the cylinder (along the Z axis) and 120° around each of the end faces.

The magnetic field polarization vector 18 of coil 16 passes through the center of the coil, i.e., through the coil axis, and is normal to the cylindrical surface to which the coil conforms. The coils of first coil pair 12 are opposite one another. The coils of second coil pair 14 are also opposite one another, and are oriented 90° with respect to the coils of first coil pair 12. The magnetic field polarization vectors 18 of the coils of first coil pair 12 are parallel to the X axis and, for this reason, the X axis may be referred to as the response axis of first coil pair 12. Similarly, the magnetic field polarization vectors 18 of the coils of second coil pair 14 are parallel to the Y axis, which may be referred to as the response axis of second coil pair 14.

The antenna system includes a first coupling circuit 20 coupled to first coil pair 12 and a second coupling circuit 22 coupled to second coil pair 14. First coil pair 12 and first coupling circuit 20 together comprise a first antenna channel. Similarly, second coil pair 14 and second coupling circuit 22 together comprise a second antenna channel.

Figure 3:
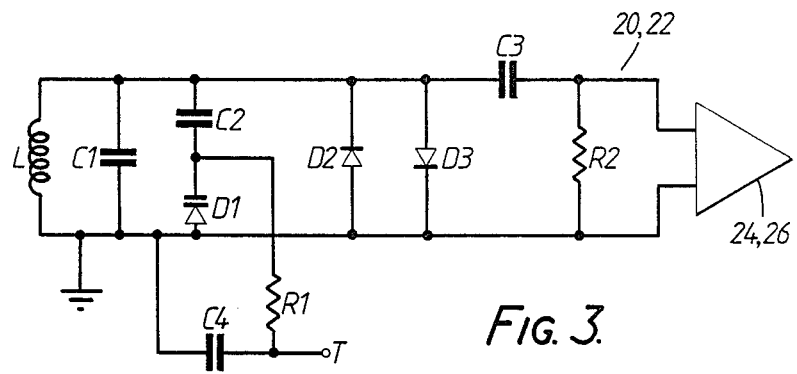
FIG. 3 is a schematic diagram of a parallel resonant antenna coupling circuit.

Coupling circuits 20 and 22 are essentially identical in design, an example of which is shown in FIG. 3. Each of the coupling circuits comprises a parallel resonant circuit. The antenna coils of the respective first and second coil pairs comprise the inductor L of the parallel resonant circuit. Capacitor C1 is a tuning capacitor. Diode D1 serves as a variable capacitor (varicap diode) and is used for tuning the resonant frequency of the coupling circuit. Diode D1 comprises a pn junction diode in parallel with coil L. The cathode of diode D1 is coupled to one end of a biasing resistor R1. The other end of biasing resistor R1 is coupled to a tuning voltage terminal T which provides a direct current ("DC") tuning voltage to the cathode of diode D1 across resistor R1. This tuning voltage provides a reverse bias on diode D1 which influences the size of the depletion region of the pn junction of diode D1, thereby controlling the capacitance of this diode. Capacitors C2 and C3 are blocking capacitors. Capacitor C2 provides DC blocking for the tuning circuit (diode D1 and external circuitry coupled at terminal T) while capacitor C3 provides a DC block for the receiving circuit. Capacitor C4 is a bypass capacitor and typically has a relatively large capacitance. Protection diodes D2 and D3 are included to arrest current surges which could damage the circuit. Resistor R2 provides a resistive load when the coupling circuit is at its resonant frequency.

Each of the coupling circuits resonates at its respective resonant frequency according to the inductance of coil L and the total capacitance of the coupling circuit. Since the capacitance of varicap diode D1 varies in accordance with the tuning voltage applied at terminal T, the resonant frequency of the channel may be adjusted or tuned by adjusting this tuning voltage.

Returning to FIG. 1, first channel coupling circuit 20 is coupled to a first channel amplifier 24 and second channel coupling circuit 22 is coupled to a second channel amplifier 26. The outputs of amplifiers 24 and 26 are coupled to a conventional quadrature hybrid network 28 which includes a quadrature combiner for shifting the relative phase of the signals on the first and second channels by 90° so they are in phase and combining these in phase signals. The output of quadrature hybrid network 28 is a combined output signal $S_o$ having an enhanced SNR, as described above.

The automatic tuning circuit of the preferred embodiment includes means for applying a test signal. The test signal applying means 30 applies a test signal to the first and second coil pairs to produce a first channel signal on the first antenna channel and a second channel signal on the second antenna channel. The first and second channel signals as induced by test applying means 30 on the respective first and second coil pairs have identical characteristics, i.e., they have the same amplitude and frequency and are in phase. When the antenna system operates properly as described above, the first and second channel signals are in phase at quadrature combiner 28 and combine to produce an output signal $S_o$ with an enhanced SNR. If, however, the phase of one of the first and second channel signals is delayed with respect to the other, these signals will not be in phase at quadrature combiner 28 and will not produce an output signal $S_o$ with the desired enhanced SNR. Thus, it is important for test signal applying means 30 to apply an identical RF signal to the first and second antenna channels.

As noted above, the response axis of first coil pair 12 is perpendicular to the response axis of second coil pair 14. Accordingly, a preferred test signal applying means includes a magnetic field source positioned at or near the origin of the X,Y,Z reference frame (described above) having a substantially linear magnetic field polarization vector passing through the origin of the reference frame and oriented 45° with respect to the response axis of each of the first and second coil pairs, i.e., in the X-Y plane and oriented 45° with respect to the X and Y axes.

Figure 4A:
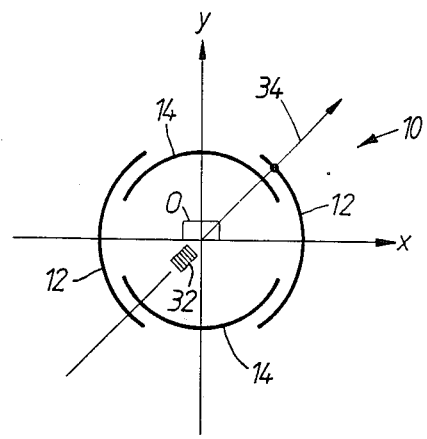
FIGS. 4A–4C are end, side, and perspective views, respectively, of the quadrature coil antenna.

The location and orientation of the test signal applying means is illustrated in FIG. 4. FIG. 4A shows an end view of antenna 10. The response axes X and Y of first coil pair 12 and second coil pair 14, respectively, are superimposed on antenna 10. The longitudinal Z axis of antenna 10 extends out from the paper normal to the X-Y plane. The object to be examined is positioned at or near the origin O of the reference frame.

Figure 4B:
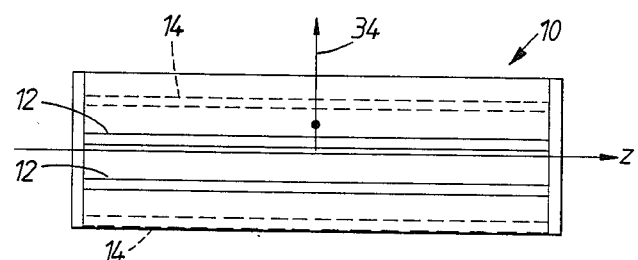
Figure 4C:
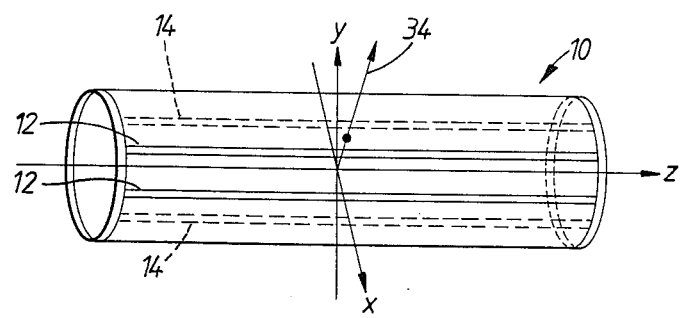

Test signal applying means 30 may take a number of forms readily apparent to one of ordinary skill in the art. Test signal applying means 30 of the preferred embodiment comprises a test coil 32 positioned directly below the origin. For example, test coil 32 may comprise a conventional 25-mm loop of subminiature coaxial cable. Electrostatic shielding is maintained by the coaxial cable shield while a small gap in the outer shield allows a magnetic field inside the loop. Test coil 32 includes, for example, a one-transistor crystal oscillator located in a well-shielded box such as an aluminum box, and powered by an internal battery such as a 3 volt camera battery. The transistor emitter current flows through the external shielded loop of test coil 32 connected to the box through a miniature coaxial cable connector. Test coil 32 is switched by external mode selection circuitry described below. This design generates an oscillating magnetic dipole perpendicular to the plane of the loop. The resulting magnetic field is linearly polarized. Thus, test coil 32, when energized, produces a substantially linear magnetic field polarization vector 34 which extends through the origin of the reference frame at a 45° angle with respect to first coil pair response axis X and second coil pair response axis Y. Test coil vector 34 is perpendicular to the longitudinal axis of antenna 10, as shown in FIGS. 4B and 4C.

The design of the first channel of the antenna system is such that the tunable range of its resonant frequency is substantially equal to that of the second channel of the antenna system. Accordingly, the frequency of the test signal is selected to be within this range, that is, equal to the resonant frequency of both the first and the second channels of the antenna system as the imaging operation of the MRI system is carried out.

The automatic tuning circuit of the preferred embodiment also includes means coupled to the first and the second antenna channels for measuring the phase of the second channel signal relative to the phase of the first channel signal to obtain an error signal representing the phase difference or phase angle between these signals.

During the imaging operation, the rotating magnetization of the precessing nuclei produces signals on the first and second antenna channels which are coherent and 90° out of phase. However, test signal applying means 30 applies the test signal to both channels simultaneously to produce first and second channel signals which have approximately equal amplitudes and are coherent and in phase. Therefore, the phase measuring means is adapted to measure the phase angle between these two coherent sinusoidal voltage signals. The phase angle is expected to be either zero or relatively small since the signals derive from a common source, i.e., the test signal, and construction of the first antenna channel is substantially identical with the design of the second antenna channel. The phase measuring means preferably produces a value of zero for the error signal when the phase angle is zero. Also, the error signal preferably has a value of zero independent of the amplitudes of the first and second channel signals when the first and second channel signals are either in phase or are 180° out of phase.

A problem in designing the phase measuring means is that accurate analog phase comparators, typically built with either diode double-balanced modulators or transistor-active multipliers, give zero output voltage for input signals having a 90° phase difference or phase angle rather than for a phase angle of zero. The output signal of such a phase comparator for a zero phase angle input is the maximum value of the phase comparator, which is a function of the amplitude of the input signals. Therefore, such a phase comparator may not be modified to give zero output for a 0° phase angle merely by subtracting a DC constant from the comparator output.

To overcome this limitation, the phase measuring means of the preferred embodiment includes a superheterodyne system which converts the input signals into a phase-shifted pair of intermediate frequency ("IF") signals. Accordingly, the phase measuring means of the preferred embodiment includes a phase meter assembly 36 which includes means for providing a first channel local oscillator signal to convert the first channel signal into a first channel IF signal, means for providing a second channel local oscillator signal 90° out of phase with respect to the first channel local oscillator signal to convert the second channel signal into a second channel IF signal, and means for measuring the phase of the second channel IF signal relative to the phase of the first channel IF signal to produce the error signal.

Figure 5:
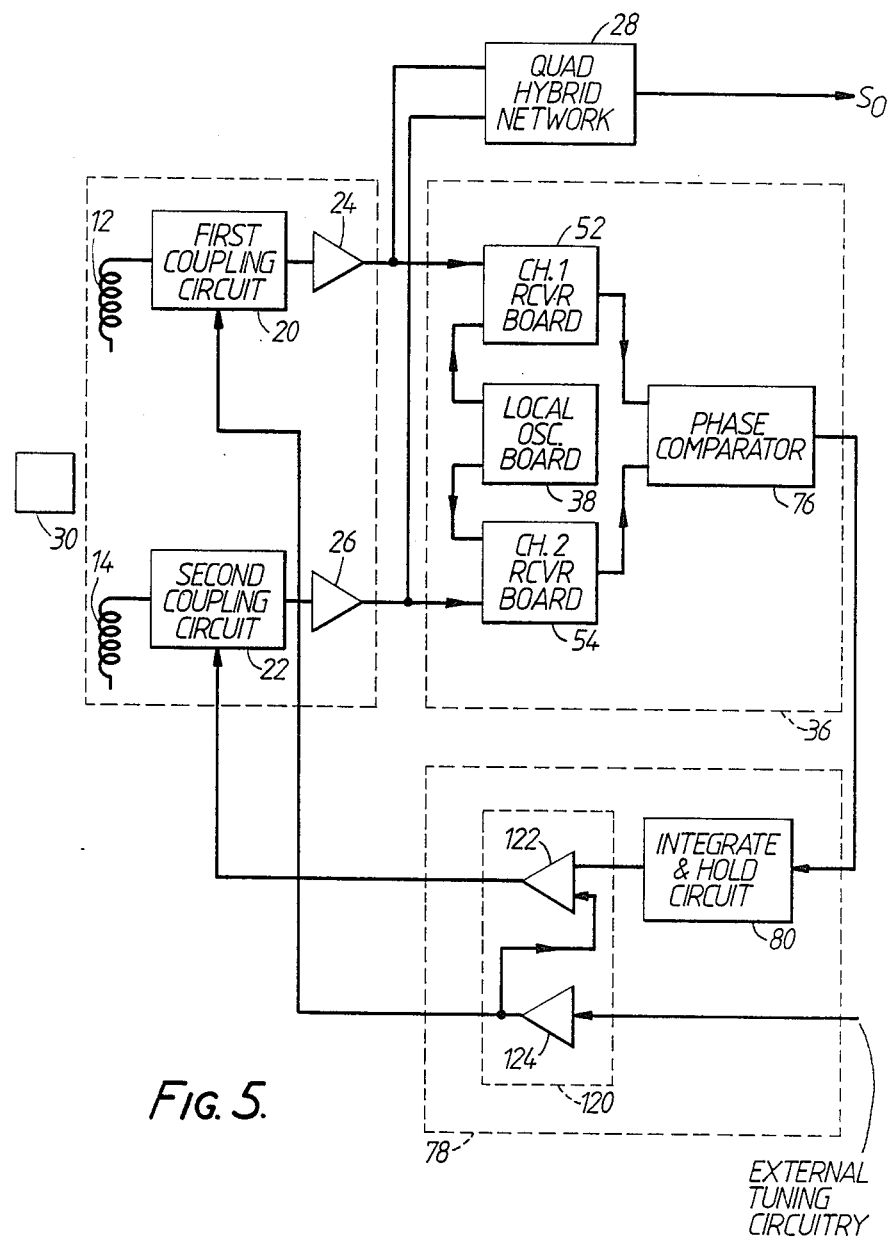
FIG. 5 is a block diagram of the automatic tuning circuit of the preferred embodiment of the invention shown in FIG. 1 which provides detail of the internal components.
Figure 6:
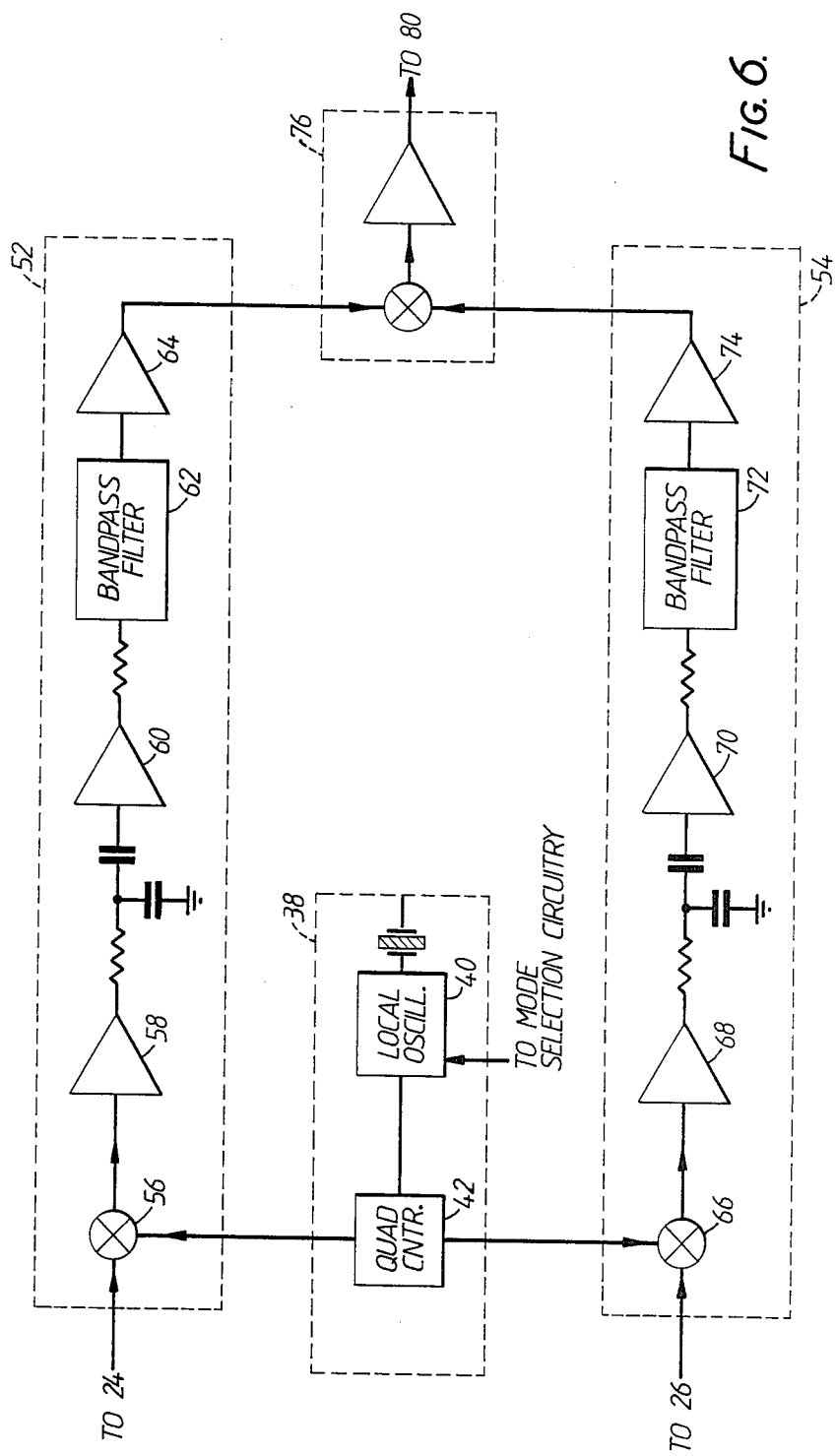
FIG. 6 is a schematic diagram of the phase measuring means of the preferred embodiment of the invention shown in FIGS. 1 and 5.
Figure 7:
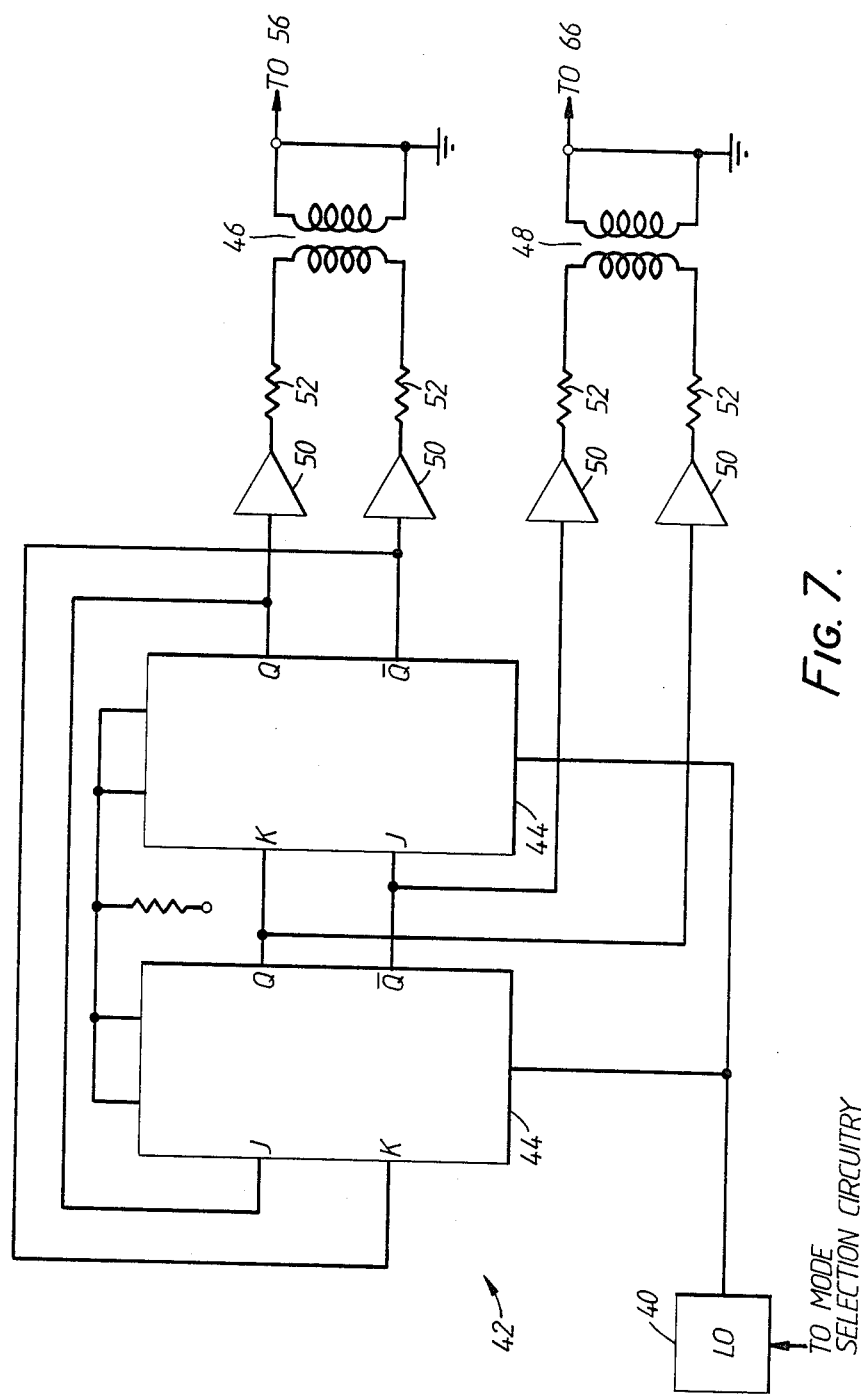
FIG. 7 is a schematic diagram of the local oscillator board of the preferred embodiment shown in FIGS. 1 and 5.

A block diagram and a schematic diagram of phase meter assembly 36 are shown in FIGS. 5 and 6, respectively. The means for providing the first and second local oscillator signals includes a local oscillator board 38. Local oscillator board 38 includes a local oscillator 40 and a quadrature counter 42 coupled to oscillator 40 (FIG. 6). Preferably, local oscillator 40 includes a hybrid crystal oscillator which provides an IF signal lower in frequency than the first and second channel signals. As shown in FIG. 7, quadrature counter 42 includes a two element counter chain 44 which receives the output signal of local oscillator 40 as a clocking signal. Counter chain 44 divides the local oscillator frequency by four, generating four square waves in quadrature at the four outputs of counter chain 44. The four outputs of counter chain 44 drive two output transformers 46 and 48 through four inverters 50. A resistor 52 at each inverter output limits the current through the adjacent half of the primary winding of the respective transformers. A first channel local oscillator signal results in the secondary winding of transformer 46. A second channel local oscillator signal 90° out of phase with the first channel local oscillator signal results in the secondary winding of transformer 48.

The means for converting the first channel signal into a first channel IF signal preferably includes local oscillator board 38 and a first channel receiver board 52, as shown in FIG. 6. Similarly, the means for converting the second channel signal into a second channel IF signal preferably includes local oscillator board 38 and a second channel receiver board 54. Receiver boards 52 and 54 are essentially identical in design and construction. Each of the receiver boards 52 and 54 includes an input mixer 56, 66, IF amplifier 58, 68, IF bandpass filter 60, 70, IF limiter 62, 72, and output amplifier 64, 74.

First channel receiver board 52 is coupled to the output of first channel amplifier 24 and to the secondary winding of transformer 46 of local oscillator board 38 at input mixer 56. Thus, input mixer 56 receives and mixes the first channel signal and the first channel local oscillator signal. The output of input mixer 56 is the first channel IF signal. IF amplifier 58, which preferably includes a linear amplifier coupled at its input to input mixer 56, amplifies the first channel IF signal. The output of IF amplifier 58 is coupled to IF limiter 60, which preferably includes a limiting amplifier for limiting the amplitude of the first channel IF signal while causing only an insignificant phase shift. IF limiter 60 is coupled to IF bandpass filter 62 which is coupled to output amplifier 64. The first channel IF signal as it appears at the output of amplifier 64 is a strongly clipped sine wave approximating a square wave.

Second channel receiver board 54 is coupled to the output of second channel amplifier 26 and to the secondary winding of transformer 48 at input mixer 66. Input mixer 66 combines the second channel signal with the second channel local oscillator signal to produce the second channel IF signal. IF amplifier 68, IF limiter 70, IF bandpass filter 72, and output amplifier 74 modify the second channel IF signal as described above with regard to the corrresponding components of first channel receiver board 52. Thus, the second channel IF signal as it appears at the output of amplifier 74 is a strongly clipped sine wave in quadrature (90° out of phase) with the first channel IF signal.

The means for measuring the phase of the second channel IF signal relative to the phase of the first channel IF signal preferably includes a phase comparator 76, which may include a diode double-balanced modulator or transistor-active multiplier. The output of each of the receiver boards, i.e., the output terminal of amplifiers 64 and 74, is coupled to phase comparator 76. Therefore, phase comparator 76 receives the first and second channel IF signals. Phase comparator 76 compares the phase of the second channel IF signal to the phase of the first channel IF signal to obtain the phase difference or phase angle of these signals. Phase comparator 76 produces as its output an error signal in the form of a DC voltage which is proportional to the phase angle.

The automatic tuning circuit of the preferred embodiment also includes means, coupled to the phase measuring means and to the second antenna channel, for adjusting the resonant frequency of the second antenna channel to obtain a desired phase relationship (i.e., 0° phase angle) between the first and second channel signals, as shown in FIGS. 1 and 5.

As described above, the test signal produces substantially identical signals i.e., the first and second channel signals, on the first and second antenna channels, respectively, and the first and second antenna channels are of substantially identical design and construction. Therefore, the phase angle between the first and second channel signals is expected to be zero. A non-zero phase angle may generally be corrected (reduced to zero) by adjusting (i.e., tuning) the resonant frequency of one of the antenna channels with respect to the other. This may be accomplished by tuning one antenna channel relative to the other antenna channel or by tuning both antenna channels. In the preferred embodiment, the second antenna channel is tuned relative to the first antenna channel.

Accordingly, the frequency adjusting means preferably comprises an auto-tune assembly 78 (FIGS. 5 and 8) for adjusting the resonant frequency of the second antenna channel. Auto-tune assembly 78 is operatively coupled to the output of phase comparator 76 and, therefore, receives the error signal as its input. Auto-tune assembly 78 is operatively coupled at its output to tuning voltage terminal T of second channel coupling circuit 22 (FIG. 3). Thus, auto-tune assembly 78 receives the error signal from phase comparator 76, translates this error signal into a second channel tuning voltage adjustment signal, and applies this adjustment signal to tuning voltage terminal T of second channel coupling circuit 22. By doing this, auto-tune assembly 78 appropriately adjusts or tunes the resonant frequency of the second antenna channel to agree with the resonant frequency of the first antenna channel.

Proper operation of the automatic tuning circuit of the present invention requires that the phase measuring means and frequency adjusting means operate in conjunction with test signal applying means 30. As noted above, the frequency of the test signal applied to the first and second antenna channels by the test signal applying means is substantially equal to the resonant frequencies of the first and second antenna channels. Therefore, operation of the automatic tuning circuit cannot be carried out simultaneously with the imaging operation of the MRI system. However, this problem may be overcome, for example, by using a time division approach in which the operation of the MRI system is divided into two portions—an imaging portion and an auto-tune portion.

The MRI system includes mode selection circuitry (not shown) which alternately selects one of the two modes—imaging and auto-tune—for example, by setting a mode selection flag. The mode selection flag is initially set to "image" to begin the imaging portion of the operating cycle.

During the transmit interval of the imaging portion, a transmitter circuit (not shown) transmits an RF pulse which emanates from antenna 10 and causes precession of the nuclei of the object under examination. The receive interval of the imaging portion begins upon completion of the transmit interval, during which the RF signal radiated by the precessing nuclei is received by antenna 10 and provided to the receiver circuitry, e.g., amplifiers 24 and 26 and quadrature hybrid network 28 (FIGS. 1 and 5). The imaging portion of the operating cycle, which includes iteration of the transmit and receive intervals, lasts for a specified duration. For example, the imaging portion of the preferred embodiment is the operating time required to obtain an image of one object, such as a patient. However, the imaging portion may be a shorter or longer time.

Upon completion of the imaging portion, the mode selection flag is set to "auto-tune" to begin the auto-tune portion of the operating cycle, during which the auto-tune circuit of the present invention is used to tune one antenna channel relative to the other antenna channel, as described above. Thus, the tuning conditions (resonant frequencies) of the respective first and second antenna channels are periodically sampled (e.g., once during each auto-tune portion) to produce the error signal. The error signal is then used to tune the second antenna channel.

At the completion of the auto-tune portion, the tuning condition of the second antenna channel is held constant relative to the tuning condition of the first antenna channel. The auto-tune portion is followed by the transmit interval of the next imaging portion. The relative tuning conditions of the first and second antenna channels are held constant during this subsequent imaging portion until the next auto-tune portion. Therefore, the imaging portion may also be referred to as a hold portion.

Accordingly, the frequency adjusting means of the preferred embodiment includes means operatively coupled to the phase measuring means for controlling the adjustment of the resonant frequency of the second channel signal, and means operatively coupled to the control means and to the second antenna channel for an applying adjustment signal to the second antenna channel to adjust the resonant frequency of the second channel signal relative to the resonant frequency of the first channel signal in response to the error signal and the control means to obtain the desired phase relationship (0° phase difference) between the first and second channel signals. Since the phase measurement process of the present invention preferably operates only during the auto-tune portion and not during the hold portion, the control means is adapted to command the adjustment signal applying means to adjust the resonant frequency of the second channel signal in response to the error signal during the auto-tune portion, and to command the adjustment signal applying means to maintain the resonant frequency of the second antenna channel signal relative to the resonant frequency of the first antenna channel during the hold portion.

Figure 8:
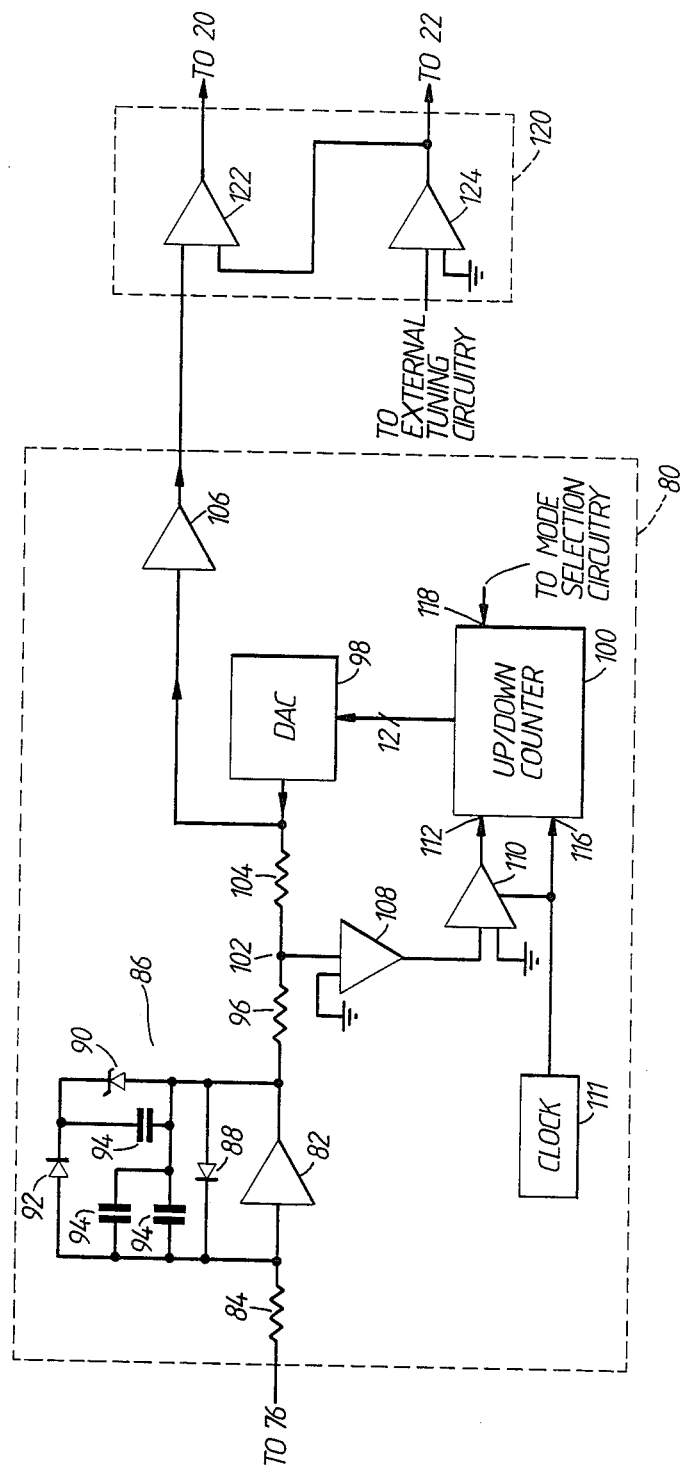
FIG. 8 is a schematic diagram of the adjusting means of the preferred embodiment of the invention shown in FIGS. 1 and 5.

The control means preferably includes an integrate and hold ("IH") circuit 80, coupled at its input to the phase measuring means and coupled at its output to the adjustment signal applying means, for integrating the error signal and providing the integrated error signal to the adjustment signal applying means, as shown in FIGS. 5 and 8. With reference to FIG. 8, IH circuit 80 includes a bounded analog integrator 82, such as an operational amplifier, coupled at its input to phase comparator 76 across an input resistor 84. A diode network 86 coupled across the input and output terminals of integrator 82 constrains the output of integrator 82 within a bounded voltage range. For example, if the output voltage exceeds an upper bound, diode 88 will conduct. If the voltage output falls below a lower bound, Zener diode 90 will conduct and forward bias diode 92. Negative feedback through either of diodes 88 or 92 prevents the output voltage of integrator 82 from further exceeding these bounds. A set of capacitors 94 are coupled across the input and output terminals of integrator 82 to provide a high frequency bypass filter and DC block. The output of integrator 82 is coupled to a resistor 96 having resistance $R_1$.

IH circuit 80 also includes a digital-to-analog converter ("DAC") 98, an up/down counter 100, and a comparator. DAC 98 is coupled to and receives its input in the form of 12-bit words from counter 100. The analog output of DAC 98 is coupled to the output of integrator 82 at a junction 102 across a resistor 104 having resistance $R_2$, which is preferably approximately 50% greater than resistance $R_1$. The output range of DAC 98 is slightly larger than is required to balance the output of integrator 82 over the full output range of integrator 82. The output of DAC 98 is also coupled to the input terminal of an output amplifier 106.

The comparator is formed by differential amplifiers 108 and 110. One input terminal of amplifier 108 is coupled to junction 102 while the other input terminal of amplifier 108 is coupled to ground. The output terminal of amplifier 108 is coupled to an input terminal of amplifier 110. The other input terminal of amplifier 110 is coupled to ground. Two Schottky diodes (not shown) are placed across amplifier 100 to limit its output swing. The output of amplifier 110 is coupled to an up/down terminal 112 of up/down counter 100. A clock 114, e.g., a free-running RC oscillator, is coupled to a clock terminal 116 of counter 100. Up/down counter 100 also has an enable terminal 118 coupled to the mode selection circuitry for monitoring the mode selection flag. Counter 100 is enabled to receive and respond to clock pulses from clock 114 only during the transmit portion.

IH circuit 80 operates in the following manner. Upon selection of the auto-tune mode by the mode selection circuitry, the error signal from phase comparator 76 is provided as an input to IH circuit 80 at an input terminal of integrator 82. The output voltage of integrator 82, bounded by diode network 86, is provided across resistor 96 to junction 102. Up/down counter 100 is enabled by the mode selection flag at enable terminal 118 so that counter 100 is clocked by clock 114. Counter 100 counts up or down depending on the output state of amplifier 110 (described below). The output of counter 100, a 12-bit digital word, is provided as an input to DAC 98. DAC 98 converts this 12-bit word into an analog output which is provided to junction 102 across resistor 104 and to the input terminal of amplifier 106. The output voltages of integrator 82 and DAC 98 as provided across resistors 96 and 104, respectively, are provided at the input of amplifier 108. The output of amplifier 108 is zero if the output voltage of DAC 98 is $(R_2/R_1)$ times the output voltage of integrator 84. The output of amplifier 108 is provided at the input of amplifier 110, where it is compared with ground.

As noted above, up/down counter 100 counts up or down as it is clocked by clock 114, depending on the output state of amplifier 110. The voltage at junction 102 attributable to the output of DAC 98 is balanced against the voltage at junction 102 attributable to integrator 82. If the output voltage of DAC 98 is sufficiently positive, the output of amplifier 108 will be negative, the output of amplifier 110 will be high, and the signal at up/down terminal 112 will be low. Counter 100 will then count up. The input to DAC 98 is complementary binary, so its analog output will go down, e.g., in microsecond steps, until the output of DAC 98 is sufficiently low, at which time counter 100 will begin to count down. The "stable" state of IH circuit 80 is thus a small oscillation around a condition in which the positive output of DAC 98 balances the negative output voltage of integrator 84.

The maximum slew rate of DAC 98 output is less than the maximum slew rate of integrator 82 output. This influences the selection of a clock speed for clock 114. Therefore, the operational speed of IH circuit 80 is limited only by the output which integrator 82 can produce.

False counts may occur on up/down counter 100 if the signal at up/down terminal 112 changes when clock 114 is low. False counts directly on the most significant digits of counter 100 produce large errors. To avoid this problem, amplifier 110 is coupled to and receives clock pulses from clock 114. The output of amplifier 110 is strobed into an internal latch of amplifier 110 by a differentiated (negative) pulse from the positive edge of clock pulses of clock 114. This active-low latch pulse also clocks an internal data register of DAC 98 so that all internal DAC bits change together.

As noted above, the analog output of DAC 98 is also provided to the input terminal of output amplifier 106. The output of amplifier 106 is a DC voltage.

The adjustment signal applying means of the preferred embodiment includes a delta-tune circuit 120, which in turn includes a DC differential summing amplifier 122. Amplifier 122 is coupled at its input to the output terminal of amplifier 106 and, therefore, receives as an input the output of amplifier 106. As illustrated by FIGS. 3 and 5, the output terminal of amplifier 122 is coupled to tuning voltage terminal T of second channel coupling circuit 22. The error signal as applied to the input of amplifier 122 from amplifier 106 causes a corresponding adjustment signal to be provided to tuning voltage terminal T of coupling circuit 22 to appropriately adjust and match the resonant frequency of the second antenna channel relative to the resonant frequency of the first antenna channel.

The adjustment signal applying means of the preferred embodiment also includes means for modifying adjustment signals to adjust the resonant frequency of the second antenna channel in coordination with an adjustment in the first antenna channel. This means preferably includes a DC differential amplifier 124. Amplifier 124 is used to adjust the resonant frequency of both antenna channels in a coordinated, simultaneous fashion. Amplifier 124 is preferably a differential amplifier capable of driving a large load capacitance without oscillation. The input of amplifier 124 is coupled to external tuning circuitry (not shown), e.g., a scanner tuning voltage source, which provides manual or automatic tuning of antenna 10. The output terminal of amplifier 124 is coupled to tuning voltage terminal T of antenna coupling circuit 20, and to an input terminal of amplifier 122. A second input terminal of amplifier 124 is coupled to ground, thus giving amplifier 124 a "quasi-differential" input where the low side has a pull-down impedance to ground, which is used to help break ground loops.

Amplifier 124 does not contribute to the auto-tune process until a coordinated change in the resonant frequencies of both antenna channels is desired. This type of adjustment is caused by an appropriate signal from the external tuning circuitry at the input to amplifier 124 (not shown). The signal is amplified by amplifier 124 and its output is provided to tuning voltage terminal T of first channel coupling circuit 20, thereby adjusting the resonant frequency of the first antenna channel. The output of amplifier 124 is also provided to the input of amplifier 122, which sums the signal with the output of amplifier 106 to provide an integrated tuning adjustment signal. This tuning adjustment signal therefore includes a component attributable to the coordinated adjustment and a component attributable to the auto-tune circuit operation (an offset voltage). Accordingly, the resonant frequencies of the antenna channels are adjusted in unison while maintaining the relative adjustment of the second antenna channel.

Conventional filtering techniques may be used in conjunction with amplifiers 122 and 124 to limit oscillations, phase shifting, and unwanted variations in output voltages. Protective circuitry may also be included.

Once the resonant frequency of the second antenna channel has been adjusted to agree with the resonant frequency of the first antenna channel during the auto-tune portion of the operating cycle, it is desirable to maintain these relative tuning conditions during the subsequent imaging portion until the next auto-tune portion. Different portions of the object under examination may be imaged and more than one object may be examined during a particular imaging portion of the operating cycle. Each of these changes causes the inductance of the antenna coils to change and requires coordinated tuning of the antenna channels of the MRI system. IH circuit 80 and, more specifically, DAC 98 provide an offset tuning voltage which accurately maintains the relative tuning conditions set during the auto-tune portion for the entire duration of the imaging portion and over a wide range of operating frequencies. This is in part due to the digital IH circuit design, which relies on digital values stored in DAC 98 that can be maintained indefinitely absent such extraneous events as power failures and the like.

Figure 9:
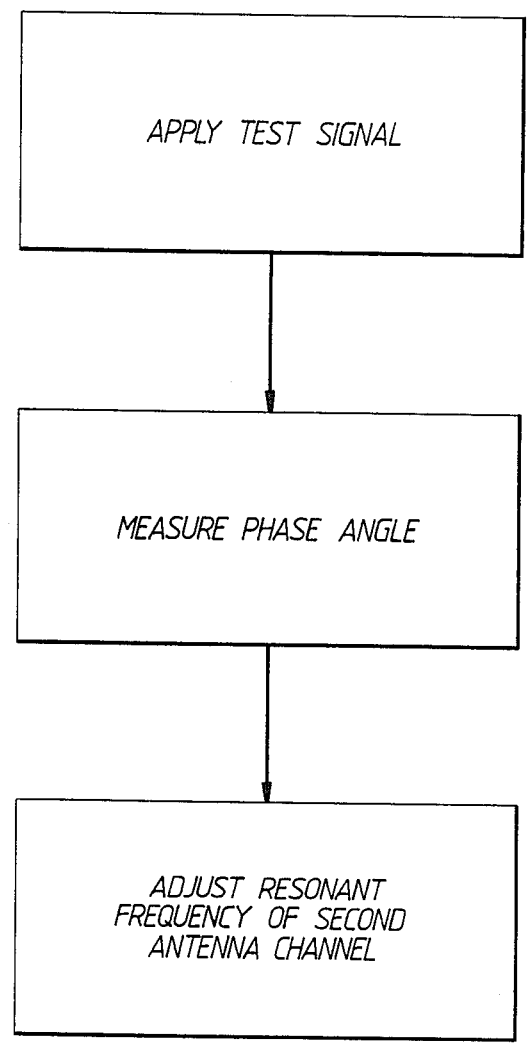
FIG. 9 is a flow chart of the preferred method of the invention.

The present invention also includes a method for automatically tuning a quadrature coil antenna system of an MRI system, as shown in FIG. 9. This preferred method will now be described in conjunction with the preferred embodiment described above.

As previously noted, the operation of the MRI system with the automatic tuning circuit of the present invention is divided into two portions—an imaging or hold portion and an auto-tune portion. The automatic tuning circuit and corresponding method of the present invention are employed during the auto-tune portion.

The preferred method includes a first step of applying a test signal having a selected magnetic field polarization vector to the first and second channels of antenna 10 to produce the first channel signal on the first antenna channel and a second channel signal on the second antenna channel. This first step is preferably performed upon initiation of the auto-tune interval, and preferably includes energizing test coil 32 to produce test coil magnetic field vector 34. The method preferably includes orienting magnetic field polarization vector 34 by 45° with respect to the response axis of each of the first and the second antenna channels. More specifically, vector 34 is positioned in the X-Y plane normal to and intersecting the Z axis and oriented 45° with respect to the X and Y axes.

A second step of the preferred method includes measuring the phase of the second channel signal relative to the phase of the first channel signal and producing an error signal corresponding to the difference of the first channel signal phase and the second channel signal phase.

In part to avoid the limitation of conventional phase comparators discussed above, the second step of the preferred method preferably includes a first substep of providing a first channel local oscillator signal and converting the first channel signal into a first channel IF signal, and a second substep of providing a second channel local oscillator signal 90° out of phase with respect to the first channel local oscillator signal and converting the second channel signal into a second channel IF signal. This second step may be carried out using phase meter assembly 36 of the preferred embodiment. Simultaneously with the application of the test signal to the antenna channels, local oscillator 40 is activated which, in conjunction with quadrature counter 42, produces the first and second channel local oscillator signals, with the phase of the second channel local oscillator signal being shifted by 90° relative to the phase of the first channel local oscillator signal. IF mixer 56 receives and mixes the first channel signal and the first channel local oscillator signal to produce the first channel IF signal. Similarly, IF mixer 66 receives and mixes the second channel signal and the second channel local oscillator signal to produce the second channel IF signal. First and second receiver boards 52 and 54 are used to modify (e.g., amplify, filter and shape) the respective signals, as described above. The outputs of receiver boards 52 and 54 are first and second channel IF signals, respectively, each being a series of clipped pulses approximating a square wave. The pulses are in quadrature, i.e., each first channel signal pulse is followed by a second channel signal pulse 90° behind the first channel signal pulse, with each pulse of the first channel signal following the next pulse of that signal by 360°, and each pulse of the second channel signal following the next pulse of that signal by 360°.

The second step of the preferred method also preferably includes a third substep of measuring the phase of the first channel IF signal relative to the phase of the second channel IF signal to produce the error signal. The first and second channel IF signals as they are outputted from the respective receiver boards are provided to phase comparator 76 where their relative phase difference is obtained and a corresponding value of the error signal is produced. Ideally, the test signal applying means applies the test signal such that the first and second channel signals are identical, i.e., in phase. A non-zero phase difference results in a corresponding non-zero value for the error signal.

The preferred method includes a third step of adjusting the resonant frequency of the second antenna channel in response to the error signal. The third step preferably includes adjusting the resonant frequency of the second antenna channel in response to the error signal during a first portion of the operating cycle of the MRI system, e.g., during the auto-tune portion, and holding the adjustment of the second antenna channel relative to the resonant frequency of the first antenna channel during a second portion of the operating cycle of the MRI system, e.g., during the hold portion. This step is preferably carried out using auto-tune assembly 78.

At the initiation of the auto-tune portion, IH circuit 80 receives the error signal at its input. The mode selection flag of the mode selection circuitry is set to auto-tune, which is received at enable terminal 118 of up/-down counter 100 to enable clock 114 to input clock pulses. IH circuit 80 is thus enabled to operate as described above. Amplifier 122 of delta-tune assembly 120 receives the output of IH circuit 80 from amplifier 106 and translates this output to a tuning adjustment signal. The tuning adjustment signal is applied to tuning voltage terminal T of antenna coupling circuit 22 to bring the resonant frequency of the second antenna channel in line with the resonant frequency of the first antenna channel. This reduces the phase angle of the first and second channel signals, and drives the error signal to zero.

At the completion of the auto-tune portion and the beginning of the hold portion, the mode selection flag sets enable terminal 118 of counter 100 to disable clock 114 from inputting clock pulses, thereby freezing and maintaining the value of counter 100, and correspondingly freezing and maintaining the outputs of DAC 98 and amplifier 106. Therefore, the adjustment signal provided at the output of amplifier 122 to tuning voltage terminal T of coupling circuit 22 is held constant during the hold portion absent an adjustment of both antenna channels at the input of amplifier 124.

As noted above, the digital design of the preferred embodiment allows the relative tuning conditions of the first and second antenna channels to be accurately maintained essentially indefinitely.

The third step of the preferred method also includes adjusting the resonant frequency of the second antenna channel in response to and in coordination with adjustments in the resonant frequency of the first antenna channel. Therefore, a coordinated adjustment is commanded by an input to amplifier 124, and this command is translated through amplifier 124 to the input of amplifier 122. The tuning adjustment signal is accordingly modified to adjust the resonant frequency of the second antenna channel in unison with the first antenna channel while maintaining the offset voltage attributable to the automatic tuning of the second channel provided by the present invention.

Additional advantages and modifications will readily occur to those skilled in the art. The invention in its broader aspects is, therefore, not limited to the specific details, representative apparatus and illustrative examples shown and described. Accordingly, departures may be made from such details without departing from the spirit or scope of the general inventive concept as defined by the appended claims and their equivalents.

What is claimed is:

1. An automatic tuning circuit for a quadrature coil antenna system of a magnetic resonance imaging system, said automatic tuning circuit comprising:
   means for applying a test signal to each of a first and a second channel of the antenna to produce a first channel signal on said first channel and a second channel signal on said second channel;
   means coupled to said first and said second antenna channels for measuring the phase of said second channel signal relative to the phase of said first channel signal to obtain an error signal; and
   means coupled to said phase measuring means and to said second antenna channel for adjusting the resonant frequency of said second channel signal in response to said error signal to obtain a desired phase relationship between said first and said second channel signals.

2. An automatic tuning circuit as recited in claim 1, wherein the test signal applying means comprises a magnetic field source having a magnetic field polarization vector oriented forty five degrees (45°) with respect to the response axis of each of the first and the second antenna channels.

3. An automatic tuning circuit as recited in claim 2, wherein the magnetic field source comprises a test coil.

4. An automatic tuning circuit as recited in claim 1, wherein the phase measuring means comprises:
   means for providing a first channel local oscillator signal to convert the first channel signal into a first channel intermediate frequency signal;
   means for providing a second channel local oscillator signal ninety degrees (90°) out of phase with respect to said first channel local oscillator signal to convert the second channel signal into a second channel intermediate frequency signal; and
   means for measuring the phase of said first channel intermediate frequency signal relative to the phase of said second channel intermediate frequency signal to produce the error signal.

5. An automatic tuning circuit as recited in claim 1, wherein the adjusting means includes:
   means operatively coupled to the phase measuring means for controlling the adjustment of the resonant frequency of the second channel signal; and
   means operatively coupled to said control means and to the second antenna channel for applying an adjustment signal to said second antenna channel to adjust the resonant frequency of said second channel signal relative to the resonant frequency of said first channel signal in response to the error signal and said control means to obtain the desired phase relationship between said first and said second channel signals.

6. An automatic tuning circuit as recited in claim 5, wherein:
   the control means is adapted to command the adjustment signal applying means to adjust the resonant frequency of the second channel signal in response to the error signal during an auto-tune interval; and
   said control means is adpated to command said adjustment signal applying means to maintain the resonant frequency of said second antenna channel relative to the resonant frequency of the first antenna channel during a hold interval.

7. An automatic tuning circuit as recited in claim 6, wherein the control means comprises an integrate and hold circuit coupled at its input to the phase measuring means and coupled at its output to the adjustment signal applying means for integrating the error signal and providing the integrated error signal to said adjustment signal applying means.

8. An automatic tuning circuit as recited in claim 5, wherein the adjustment signal applying means includes means for modifying the adjustment signal to adjust the resonant frequency of the second antenna channel in coordination with an adjustment in the first antenna channel.

9. A method for automatically tuning a quadrature coil antenna system of a magnetic resonance imaging system, said method comprising:
   a first step of applying a test signal having a selected magnetic field polarization vector to a first and a second channel of said antenna to produce a first channel signal on said first antenna channel and a second channel signal on said second antenna channel;
   a second step of measuring the phase of said second channel signal relative to the phase of said first channel signal and producing an error signal corresponding to the difference of said first channel signal phase and said second channel signal phase; and
   a third step of adjusting the resonant frequency of said second antenna channel in response to said error signal.

10. A method as recited in claim 9, wherein the first step includes orienting the magnetic field polarization vector forty-five degrees (45°) with respect to the response axis of each of the first and the second antenna channels.

11. A method as recited in claim 9, wherein said second step includes:
   a first substep of providing a first channel local oscillator signal and converting the first channel signal into a first channel intermediate frequency signal;
   a second substep of providing a second channel local oscillator signal ninety degrees (90°) out of phase with respect to the first channel local oscillator signal and converting the second channel signal into a second channel intermediate frequency signal; and
   a third substep of measuring the phase of said first channel intermediate frequency signal relative to the phase of said second channel intermediate frequency signal to produce the error signal.

12. A method as recited in claim 9, wherein the third step includes adjusting the resonant frequency of the second antenna channel in response to said error signal during a first portion of an operating cycle of the magnetic resonance imaging system, and holding the adjustment of said second antenna channel relative to the resonant frequency of the first antenna channel during a second portion of said operating cycle of said magnetic resonance imaging system.

13. A method as recited in claim 9, wherein the third step includes adjusting the resonant frequency of the second antenna channel in response to and in coordination with adjustments in the resonant frequency of the first antenna channel.

* * * * *